(12) United States Patent
Sills et al.

(10) Patent No.: US 9,466,504 B1
(45) Date of Patent: Oct. 11, 2016

(54) METHODS OF FABRICATING FEATURES ASSOCIATED WITH SEMICONDUCTOR SUBSTRATES

(71) Applicant: Micron Technology, Inc., Boise, ID (US)

(72) Inventors: Scott E. Sills, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/674,127

(22) Filed: Mar. 31, 2015

(51) Int. Cl.
*H01L 21/308* (2006.01)

(52) U.S. Cl.
CPC ....... *H01L 21/3081* (2013.01); *H01L 21/3086* (2013.01)

(58) Field of Classification Search
CPC .................. H01L 21/3081; H01L 21/3086
See application file for complete search history.

(56) References Cited

U.S. PATENT DOCUMENTS

| 9,330,932 | B1* | 5/2016 | Sills | H01L 21/02359 |
| 2003/0199090 | A1* | 10/2003 | Monahan | A61K 48/0008 435/455 |
| 2004/0242023 | A1 | 12/2004 | Yan et al. | |
| 2005/0158880 | A1 | 7/2005 | Ostuni et al. | |
| 2008/0182402 | A1 | 7/2008 | Li et al. | |
| 2010/0024732 | A1* | 2/2010 | Mokhlesi | C23C 16/308 118/724 |
| 2012/0046415 | A1 | 2/2012 | Millward et al. | |
| 2013/0012033 | A1* | 1/2013 | Kabe | H01J 37/32192 438/771 |
| 2014/0203360 | A1 | 7/2014 | Cao et al. | |

FOREIGN PATENT DOCUMENTS

WO    WO    5/2016
PCT/US2016/018073

OTHER PUBLICATIONS

Andersen et al., "Self-assembly of a nanoscale DNA box with a controllable lid," Nature, vol. 459, May 2009, pp. 73-77.
Kershner et al., "Placement and orientation of individual DNA shapes on lithographically patterned surfaces," Nature Nanotechnology, Published Online Aug. 16, 2009 at www.nature.com/naturenanotechnology, pp. 1-5.
Surwade et al., "Nanoscale Growth and Patterning of Inorganic Oxides Using DNA Nanostructure Templates," Journal of the American Chemcial Society, vol. 135, Apr. 10, 2013, pp. 6778-6781.
Wei et al., "Complex shapes self-assembled from single-stranded DNA tiles," Nature, vol. 485, May 31, 2012, pp. 623-627.

\* cited by examiner

*Primary Examiner* — Duy Deo
(74) *Attorney, Agent, or Firm* — Wells St. John P.S.

(57) ABSTRACT

Some embodiments include a method of fabricating features associated with a semiconductor substrate. A first region of the semiconductor substrate is altered relative to a second region. The altered first region has different physisorption characteristics for polynucleotide relative to the second region. The altered first region and the second region are exposed to polynucleotide. The polynucleotide selectively adheres to either the altered first region or the second region to form a polynucleotide mask. The polynucleotide mask is used during fabrication of features associated with the semiconductor substrate.

33 Claims, 8 Drawing Sheets

METHODS OF FABRICATING FEATURES ASSOCIATED WITH SEMICONDUCTOR SUBSTRATES

TECHNICAL FIELD

Methods of fabricating features associated with semiconductor substrates.

BACKGROUND

A variety of methods have been developed for creating patterned masks suitable for patterning underlying materials during fabrication of integrated circuitry. A continuing goal of integrated circuit fabrication is to increase integrated circuit density, and accordingly to decrease the size of individual integrated circuit components. There is thus a continuing goal to form patterned masks having reduced feature sizes.

A typical patterned mask utilized for integrated circuit fabrication is photolithographically-patterned photoresist. Such may be utilized to form feature sizes approaching about 40 nanometers (nm). Sublithographic feature sizes may be formed utilizing pitch-multiplication methodologies (which reduce pitch size by a given multiple; for instance, pitch-doubling methodology reduces pitch size by a multiple of two). However, pitch-multiplication methodologies may be costly due to the complexities associated with such methodologies. Another method showing promise for creating sublithographic feature sizes involves self-assembly of block copolymer to form repeating patterns. Unfortunately, there is often poor control of the final pattern created with the block copolymer. Accordingly, there may be too many defects remaining in the final pattern for commercial viability.

It is desirable to develop new methods for patterning sublithographic features suitable for semiconductor fabrication.

DETAILED DESCRIPTION OF THE ILLUSTRATED EMBODIMENTS

Polymer which may be utilized to form patterns with a high degree of specificity is polynucleotide (for instance, deoxyribonucleic acid [DNA], ribonucleic acid [RNA], etc.). In some embodiments, methods are developed for selective physisorption of polynucleotide on one region of a semiconductor substrate relative to another during fabrication of features associated with the semiconductor substrate. In some embodiments the features may be sublithographic, and may have dimensions much smaller than 40 nm; such as, for example, dimensions of less than or equal to about 10 nm, less than or equal to about 5 nm, etc.

For purposes of interpreting this disclosure and the claims that follow, the term "polynucleotide" means a polymer comprising two or more nucleotides. There is some historic distinction between polymers referred to as "polynucleotide" and polymers referred to as "oligonucleotide", with both comprising the same subunits and "polynucleotides" being understood to be longer than "oligonucleotides". For purposes of interpreting this disclosure and the claims that follow, the term "polynucleotide" is used to encompass all polymer lengths, and accordingly to generically encompass polymer lengths sometimes referred to in the art as "oligonucleotides", as well as the longer polymer lengths.

The term "physisorption" as used herein is generic for any non-covalent mechanism of adsorption, attraction or adhesion; including, for example, van der Waals interactions, ionic bonding interactions, hydrogen bonding interactions, electrostatic interactions, etc.

Example embodiments are described with reference to FIGS. 1-27.

Figure 1:
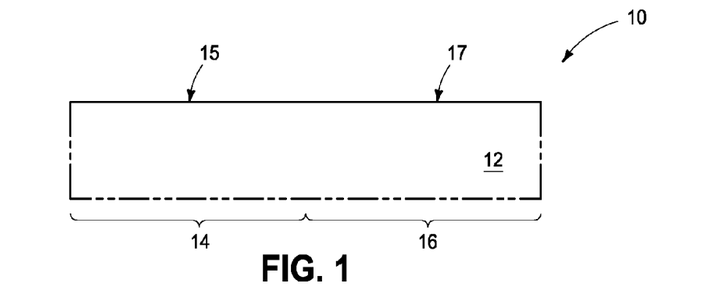
FIGS. 1-27 are diagrammatic cross-sectional views of example constructions at process stages of example methods.

Referring to FIG. 1, a construction 10 comprises a semiconductor substrate 12. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. The semiconductor substrate 12 may comprise any suitable semiconductor material, and in some embodiments may comprise, consist essentially of, or consist of monocrystalline silicon.

In some embodiments, semiconductor substrate 12 may comprise one or more materials associated with integrated circuit fabrication. Some of the materials may be under the shown region of semiconductor substrate 12 and/or may be laterally adjacent the shown region of semiconductor substrate 12; and may correspond to, for example, one or more of refractory metal materials, barrier materials, diffusion materials, insulator materials, etc.

The semiconductor substrate 12 is shown comprising a first and a second region 16. The first and second regions have uppermost surfaces 15 and 17, respectively. In some embodiments, it is desired to form a polynucleotide mask across one of the first and second regions selectively relative to the other of the first and second regions. For instance, in some embodiments a memory array is formed across one of the first and second regions, while peripheral circuitry is formed across the other of the first and second regions. The polynucleotide mask may be utilized for fabricating densely-spaced components of the memory array. Accordingly, it may be desired to form the polynucleotide mask across the memory array region, but not across the peripheral region. In other embodiments, the polynucleotide mask may be utilized for selectively fabricating peripheral circuitry relative to memory array circuitry; or for other applications. Regardless, it is desired to selectively form the polynucleotide mask so that it is on one of the regions 14 and 16, and not the other.

In some embodiments, one of the regions 14 and 16 is treated so that such region has different physisorption characteristics for polynucleotide relative to the other of the regions 14 and 16. The treatment may comprise one or more of a dopant implant, provision of electrical bias, formation of a molecular arrangement with positively-charged terminal groups or negatively-charged terminal groups, etc. Various example embodiments for altering physisorption characteristics of a region of a semiconductor substrate are described with more specificity with reference to FIGS. 10-27. The polynucleotide over a region of a semiconductor substrate may be utilized for fabricating features, and example methods of such feature fabrication are described with reference to FIGS. 2-9.

Figure 2:
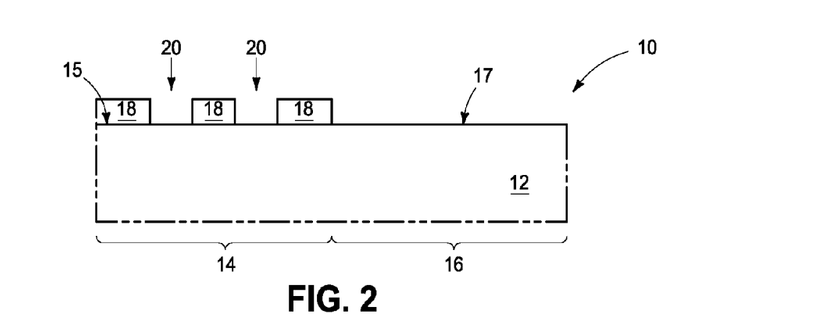

FIG. 2 shows construction 10 at a processing stage after one of the regions 14 and 16 is treated to alter its physisorption characteristics for polynucleotide relative to the other region, and after exposure to polynucleotide 18 under suitable conditions for physisorption. Such conditions may include, for example, appropriate pH, ionic strength, etc. In the shown embodiment, the polynucleotide selectively adheres to the surface 15 of region 14 relative to the surface 17 of region 16 due to the different physisorption characteristics of the regions.

The illustrated polynucleotide self-assembles into a pattern comprising spaces 20. Such pattern is further illustrated in a top view of FIG. 2A (only some of the spaces 20 are labeled in the top view of FIG. 2A).

The polynucleotide may comprise any suitable composition for achieving the desired self-assembly. For instance, the polynucleotide may correspond to DNA, and the self-assembly may occur through DNA origami assembly, DNA canvas assembly (i.e., assemblies comprising DNA tiles), etc. As another example, the polynucleotide may correspond to RNA, and the self-assembly may occur through RNA canvas assembly (i.e., assemblies comprising RNA tiles), etc. Example structures that may be formed through polynucleotide self-assembly are described in Wei et al., "Complex shapes self-assembled from single-stranded DNA tiles," Nature, Vol. 485, (May 31, 2012), pp. 623-626; Kershner et al. "Placement and orientation of individual DNA shapes on lithographically patterned surfaces," Nature Nanotechnology, (Aug. 16, 2009), pp. 1-4; and Anderson et al., "Self-assembly of a nanoscale DNA box with a controllable lid," Nature Vol. 459, (May 7, 2009), pp. 73-76.

Figure 2A:
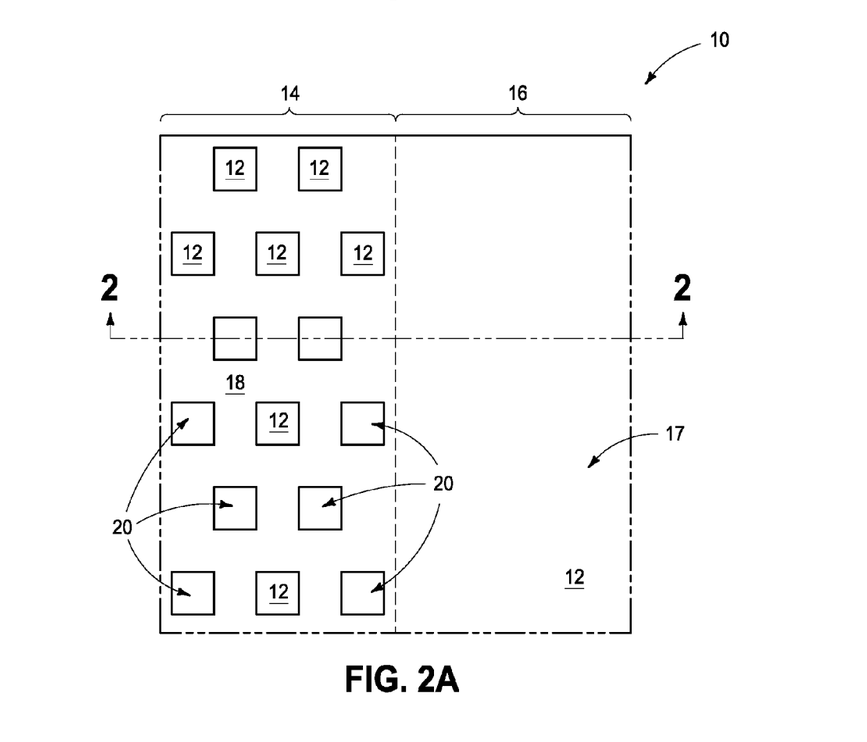
FIG. 2A is a top view of the construction of FIG. 2, with the view of FIG. 2 being along the line 2-2 of FIG. 2A.

The illustrated pattern of FIGS. 2 and 2A is an example pattern. Self-assembly of polynucleotide may be utilized to create other desired patterns in other embodiments. The specific pattern of FIGS. 2 and 2A may be utilized to fabricate a tight spacing of contacts or other features, and may be utilized, for example, to fabricate highly-integrated memory, sensors logic, MEMS (microelectromechanical systems), etc.

Figure 3:
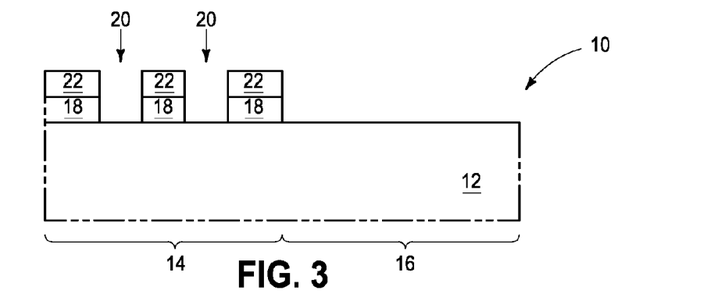

The polynucleotide 18 may be considered to be a polynucleotide mask formed over semiconductor substrate 12. Numerous methods may be utilized for transferring a pattern from the polynucleotide mask to the underlying semiconductor substrate 12. Example methods are described with reference to FIGS. 3-8. Referring to FIG. 3, a material 22 is selectively formed on an upper surface of polynucleotide 18 relative to upper surfaces of substrate 12. The material 22 may comprise any suitable material. For instance, in some embodiments material 22 may comprise electrically insulative material (for instance, silicon dioxide), or electrically conductive material (for instance, metal or metal-containing compositions). Example methods for adhering material selectively to polynucleotide relative to other surfaces are described in, for example, Surwade et al., "Nanoscale growth and patterning of inorganic oxides using DNA nanostructures templates," Journal of the American Chemical Society (2013), 135, pp 6778-6781.

Figure 4:
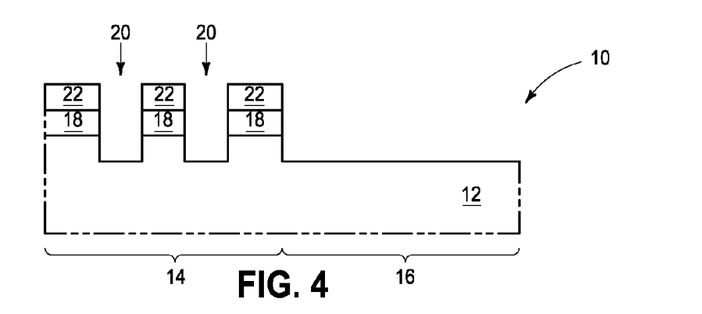
Figure 5:
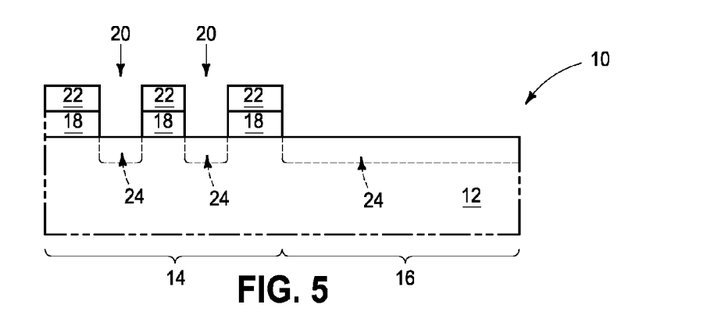

Referring to FIGS. 4 and 5, the material 22 may be utilized as a mask for fabricating features associated with semiconductor substrate 12. FIG. 4 shows an application in which the material 22 is utilized as an etch mask to protect underlying features during an etch into semiconductor substrate 12. FIG. 5 shows an application in which the material 22 is utilized as a mask during implanting of dopant into the exposed regions of a semiconductor substrate 12 to form doped regions 24. The processing of FIGS. 4 and 5 may also be combined so that etching is conducted into the exposed regions of semiconductor substrate 12, and dopant is implanted into the exposed regions. In some embodiments, processing of FIGS. 4 and 5 may be combined with other masking processes (for example, photolithography). Thus, region 16 may be protected with a photolithographically-patterned mask during the etch of FIG. 4 or the implant of FIG. 5.

The patterns established by material 22 in FIGS. 4 and 5 are defined by the polynucleotide mask formed with polynucleotide 18. Such polynucleotide mask may or may not remain under material 22 during the processing of FIGS. 4 and 5, depending on whether or not the polynucleotide can survive the processing conditions.

Figure 6:
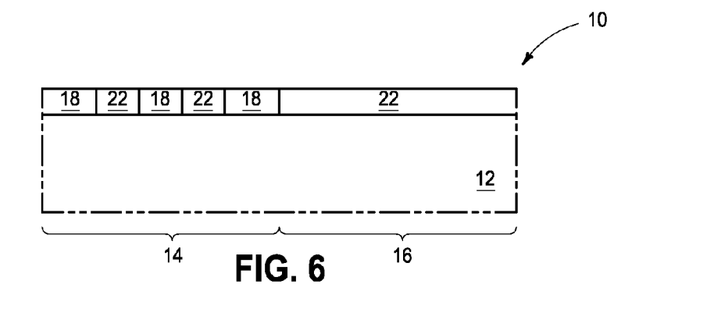

The processing of FIG. 3 forms a positive mask over polynucleotide 18 (i.e., the mask has the same shape as the underlying polynucleotide). In other embodiments, a negative mask may be formed relative to the polynucleotide 18 (i.e., the mask may have a complementary shape relative to the underlying polynucleotide). FIG. 6 shows construction 10 at a processing stage subsequent to that of FIG. 2 in accordance with an embodiment in which masking material 22 forms a negative mask relative to polynucleotide 18. Example methods for forming a negative mask relative to polynucleotide are described in, for example, Surwade et al., "Nanoscale growth and patterning of inorganic oxides using DNA nanostructures templates," Journal of the American Chemical Society (2013), 135, pp 6778-6781.

Figure 7:
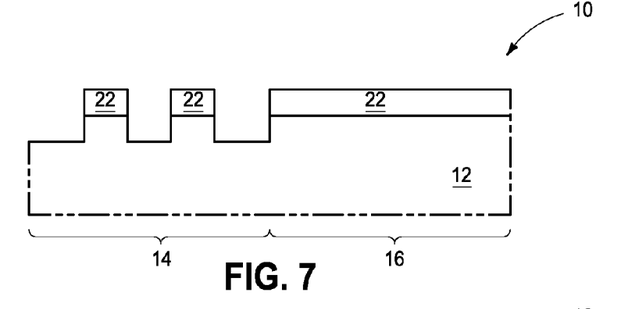
Figure 8:
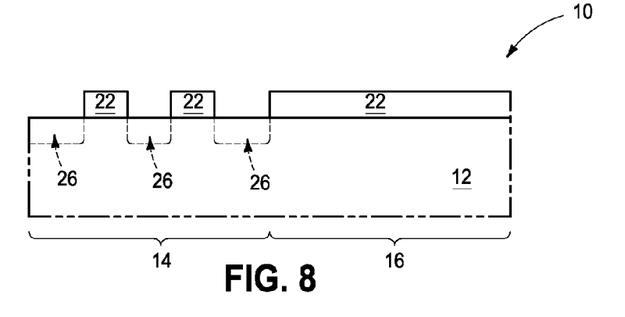

Referring to FIGS. 7 and 8, the polynucleotide 18 (FIG. 6) is removed and the remaining material 22 is utilized as a mask for fabricating features associated with semiconductor substrate 12. FIG. 7 shows an application in which the material 22 is utilized as an etch mask to protect underlying features during an etch into semiconductor substrate 12. FIG. 8 shows an application in which the material 22 is utilized as a mask during implanting of dopant into the exposed regions of a semiconductor substrate 12 to form doped regions 26. The processing of FIGS. 7 and 8 may also be combined so that etching is conducted into the exposed regions of semiconductor substrate 12, and dopant is implanted into the exposed regions. In some embodiments, processing of FIGS. 7 and 8 may be combined with other masking processes (for example, photolithography). The patterns established by material 22 in FIGS. 7 and 8 are defined by the polynucleotide mask formed with polynucleotide 18, and correspond to an approximate inverse image of such pattern.

Figure 9:
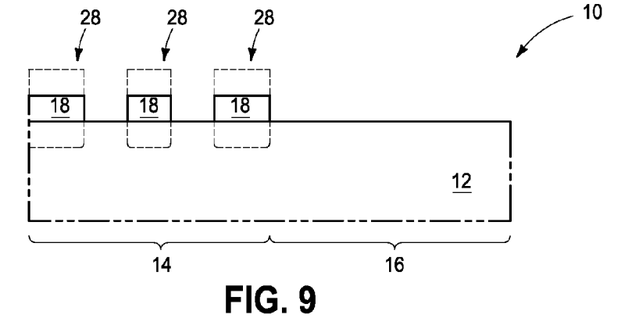

In some embodiments, polynucleotide 18 is a sacrificial material utilized for patterning features associated with semiconductor substrate 12. In other embodiments, polynucleotide 18 may be incorporated into the features associated with semiconductor substrate 12. In some embodiments polynucleotide 18 may be referred to as a "polynucleotide mask" incorporated into features associated with semiconductor substrate 12. In such embodiments, at least some of the "polynucleotide mask" corresponds to patterned polynucleotide suitable for incorporation into the desired features; and may or may not also be used for patterning etches, implants, etc. as a traditional "mask". FIG. 9 illustrates an example embodiment in which polynucleotide 18 is incorporated into an integrated assembly, and specifically is incorporated into features 28. Such features may comprise, for example, transistors, wiring, etc. The polynucleotide may be an important component of the features. For instance, the polynucleotide may provide desired physical and/or chemical properties to the features. Further, the polynucleotide may be configured for specific binding of one or more molecules, and such binding may alter electrical properties of the features so that the polynucleotide may be incorporated into an indicator for detecting the presence of such molecules, and possibly also for determining a concentration of the molecules (i.e., in sensor applications).

Figure 10:
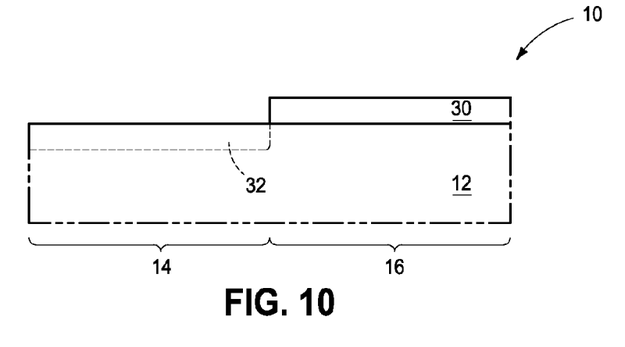
Figure 11:
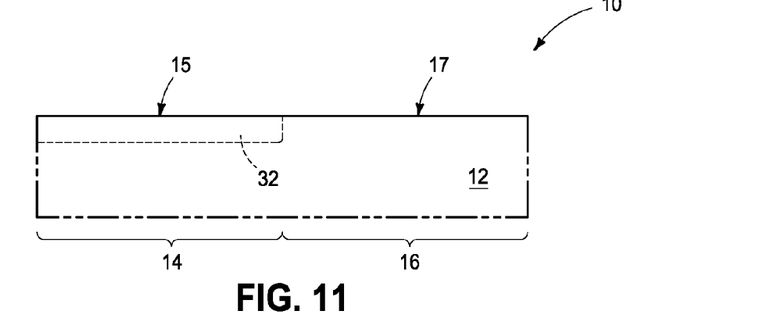

FIGS. 10 and 11 illustrate an example method for altering one of the regions 14 and 16 relative to the other. FIG. 10 shows a mask 30 formed across region 16 relative to region 14. Such mask may be formed with any suitable processing, including, for example, photolithographic processing, pitch-multiplication processing, etc. In some embodiments, mask 30 may comprise photoresist.

The mask 30 protects region 16 while leaving the region 14 exposed. In some embodiments, the mask 30 over region 16 is enough to create the difference in physisorption desired so that polynucleotide specifically adheres to region 14 relative to region 16 (or vice versa). In some embodiments, the physisorption may be enhanced by providing dopant within region 14. For instance, dopant may be implanted into the exposed region 14 to form the doped region 32. The polynucleotide may be specifically adhered to region 14 after formation of the doped region 32. The mask 30 may remain over region 16 while the polynucleotide is adhered to region 14, or alternatively the mask 38 may be removed.

FIG. 11 shows a processing stage subsequent to that of FIG. 10, and shows mask 30 removed. The construction 10 of FIG. 11 may be subsequently exposed to polynucleotide, and the polynucleotide may selectively adhere to region 14 relative to region 16 due to the doped region 32. Alternatively, the polynucleotide may specifically adhere to region 16 relative to region 14 due to the doped region 32; depending on the type of dopant utilized, the surface characteristics of regions 14 and 16, etc.

The doping of FIG. 10 may be accomplished with any suitable processing. For instance, dopant may be implanted into substrate 12 with conventional implantation technology, and may be implanted to form a relatively deep doped region 32. Alternatively, the dopant may be implanted utilizing shallow ion implantation and/or plasma doping (PLAD) to form a relatively shallow doped region 32.

The dopant within doped region 32 may be any suitable dopant including, for example, p-type dopant, n-type dopant, neutral dopant, metal, etc. For instance, in some embodiments, the dopant may comprise one or more of phosphorus, arsenic, boron, magnesium, potassium, calcium, etc.

The construction 10 at the processing stage of FIG. 11 has an altered first region 14 with different physisorption characteristics for polynucleotide relative to the second region 16. The altered first region may have enhanced affinity for polynucleotide relative to the second region in some embodiments, and in other embodiments may have reduced affinity for polynucleotide relative to the second region. Subsequent processing analogous to that described above with reference to FIGS. 1-9 may be conducted to form a polynucleotide mask across one of the regions 14 and 16 of FIG. 11, and to utilize such mask for fabrication of features associated with semiconductor substrate 12.

Figure 12:
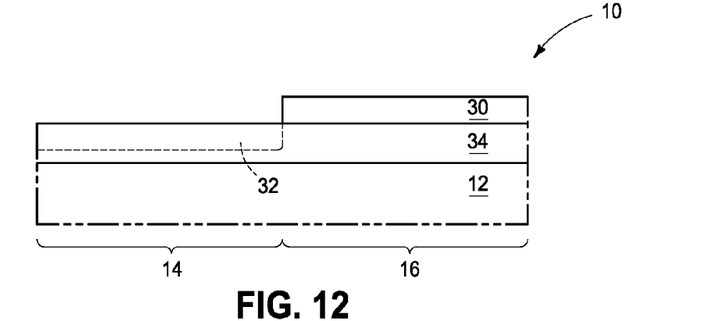
Figure 13:
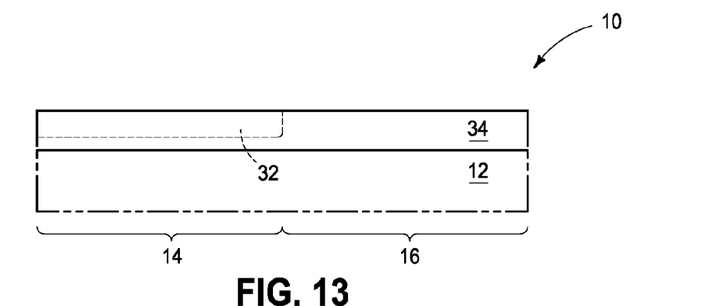

The exposed surfaces 15 and 17 of regions 14 and 16 at the processing stage of FIG. 11 may comprise semiconductor material of substrate 12. Alternately, one or both of such exposed surfaces may comprise insulative material and/or conductive material formed across semiconductor material of substrate 12. For instance, FIGS. 12 and 13 show construction 10 at processing stages analogous to those of FIGS. 10 and 11, respectively, but in which a second material 34 is formed across semiconductor material of substrate 12. The second material may be conductive, insulative or semiconductive. The doped region 32 extends into the second material to alter polynucleotide physisorption characteristics of the second material within region 14 relative to the second material within region 16. In the shown embodiment doped region 32 extends only into material 34, but in other embodiments the doped region may extend through material 34 and into underlying material of substrate 12.

The construction 10 at the processing stage of FIG. 13 has an altered first region 14 with different physisorption characteristics for polynucleotide relative to the second region 16. The altered first region may have enhanced affinity for polynucleotide relative to the second region in some embodiments, and in other embodiments may have reduced affinity for polynucleotide relative to the second region. Subsequent processing analogous to that described above with reference to FIGS. 1-9 may be conducted to form a polynucleotide mask across one of the regions 14 and 16 of FIG. 13, and to utilize such mask for fabrication of features associated with semiconductor substrate 12.

Figure 14:
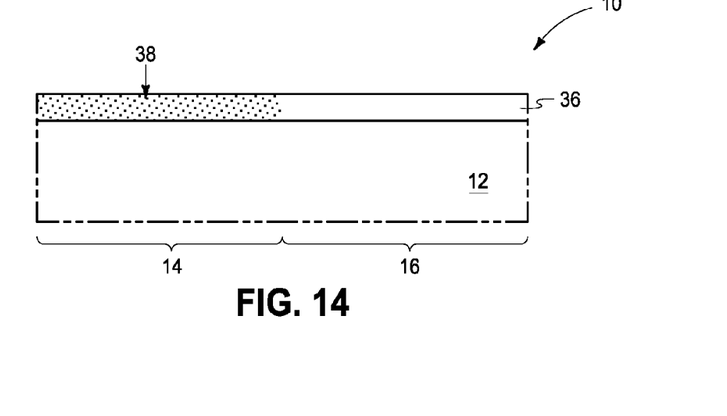

Dopant may be provided selectively into one of regions 14 and 16 relative to the other with any suitable processing. The processing of FIGS. 9-13 comprises direct implanting of dopant into a material. Another method is to provide dopant within a sacrificial layer, and to then transfer dopant from the sacrificial layer into one of the regions 14 and 16. For instance, FIG. 14 shows construction 10 at a processing stage in which a sacrificial layer 36 is formed across substrate 12. The sacrificial layer has dopant 38 provided therein, with such dopant being indicated by stippling.

Figure 15:
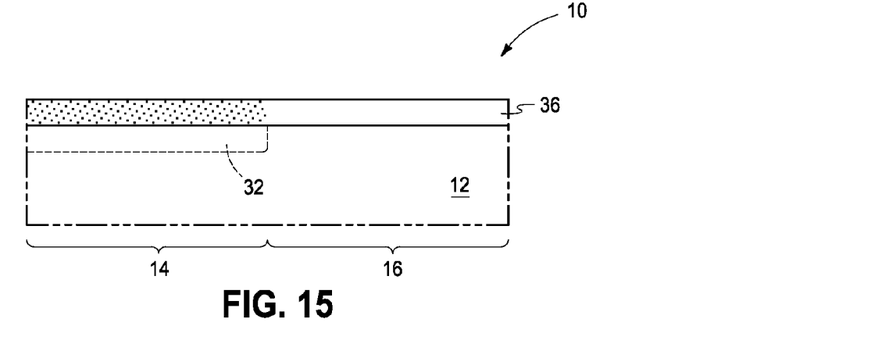

Referring next to FIG. 15, at least some of the dopant is transferred from the layer 36 into semiconductor substrate 12 to form the doped region 32 within substrate 12. Such transfer may be accomplished utilizing thermal anneal conditions, electric field conditions, electrochemical conditions, or any other suitable methodology.

Figure 16:
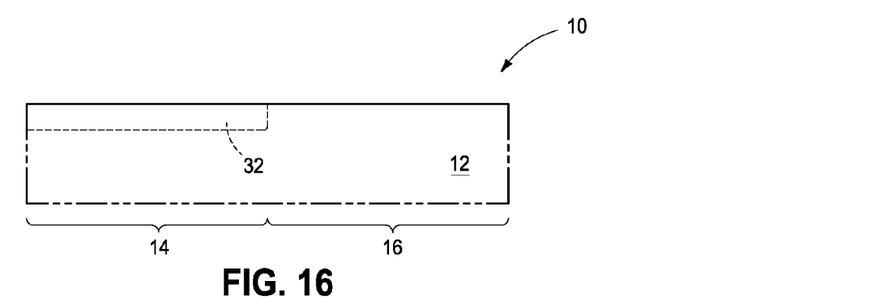

Referring to FIG. 16, layer 36 (FIG. 15) is removed to leave a construction analogous to that described above with reference to FIG. 11. In other example embodiments, a second layer analogous to the layer 34 of FIG. 12 may be formed across substrate 12 prior to forming sacrificial layer 36, and the construction of FIG. 16 may be fabricated to be analogous to that of FIG. 13.

The construction 10 at the processing stage of FIG. 16 has an altered first region 14 with different physisorption characteristics for polynucleotide relative to the second region 16. The altered first region may have enhanced affinity for polynucleotide relative to the second region in some embodiments, and in other embodiments may have reduced affinity for polynucleotide relative to the second region. Subsequent processing analogous to that described above with reference to FIGS. 1-9 may be conducted to form a polynucleotide mask across one of the regions 14 and 16 of FIG. 16, and to utilize such mask for fabrication of features associated with semiconductor substrate 12.

Figure 17:
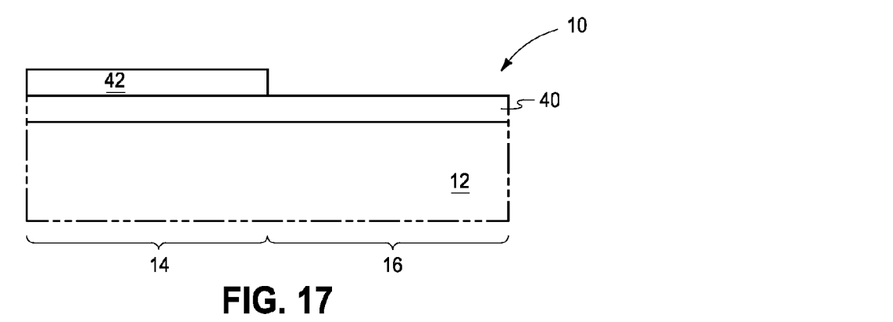

Another method for altering polynucleotide physisorption characteristics of region 14 relative to region 16 is described with reference to FIGS. 17 and 18. Referring to FIG. 17, a material 40 is formed across the semiconductor substrate 12. Material 40 may have components incorporated therein which alter physisorption characteristics of the material for polynucleotide. Such components may include chemical species (for instance, organometallic substances, hydrogen, organo-alkaline earth compounds, magnesium ion, calcium ion, etc.); and/or may include trapped charges (e.g., unsaturated bonds, dangling bonds, unbound electrons, etc.). Material 40 may be insulative, conductive, semiconductive, etc.

The material 40 may be deposited with any suitable methodology including, for example, chemical vapor deposition (CVD), atomic layer deposition (ALD), plasma-enhanced chemical vapor deposition (PECVD), etc. In some embodiments, charging or polarizing components may be introduced in a gas flow during a deposition process (for instance, CVD, ALD and/or reactive sputtering) to incorporate desired components within the material 40. For instance, additional hydrogen may be introduced into the gas flow. Additionally, or alternatively, one or both of various organometallic materials and/or various organo-alkaline earth compounds may be introduced into the gas flow. Example materials are calcium bis (2,2,6,6-tetramethyl-3,5-heptanedionate), calcium 2-ethylhexanoate, calcium methoxide, bis (2,2,6,6-tetramethyl-3,5-heptanedionato) magnesium II dihydrate, etc.

In some embodiments, material 40 may comprise a composition deposited under conditions which incorporate trapped charges within at least a portion of the thickness of material 40. Such composition may comprise, for example, silicon dioxide, silicon nitride, carbon, etc.

A masking material 42 is formed and patterned over material 40. The masking material may comprise any suitable material, and in some embodiments may comprise photoresist patterned utilizing photolithography and/or may comprise material patterned utilizing pitch-multiplication methodologies.

Figure 18:
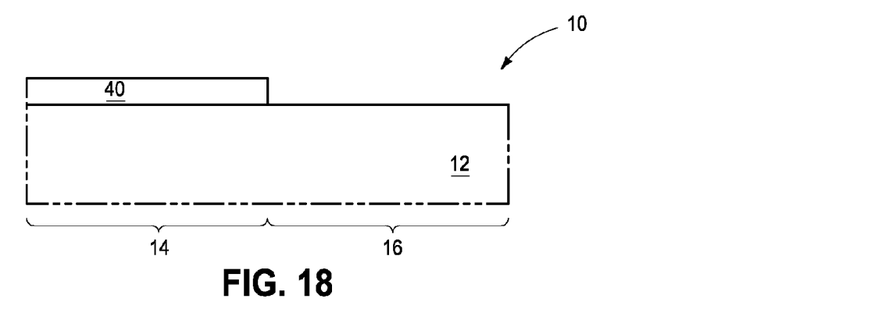

Referring to FIG. 18, material 40 is patterned utilizing masking material 42 (FIG. 17) and an appropriate etch, and subsequently masking material 42 is removed. The construction 10 of FIG. 18 comprises a region 14 with an upper surface corresponding to the upper surface of material 40, and a region 16 with an upper surface corresponding to the upper surface of substrate 12. The upper surface of region 14 may have different physisorption characteristics for polynucleotide relative to the upper surface of region 16. Depending on the nature of material 40 and substrate 12, region 14 may have enhanced physisorption of polynucleotide as compared to region 16 or may have reduced physisorption of polynucleotide as compared to region 16.

The construction 10 at the processing stage of FIG. 18 has an altered first region 14 with different physisorption characteristics for polynucleotide relative to the second region 16. The altered first region may have enhanced affinity for polynucleotide relative to the second region in some embodiments, and in other embodiments may have reduced affinity for polynucleotide relative to the second region. Subsequent processing analogous to that described above with reference to FIGS. 1-9 may be conducted to form a polynucleotide mask across one of the regions 14 and 16 of FIG. 18, and to utilize such mask for fabrication of features associated with semiconductor substrate 12.

Figure 19:
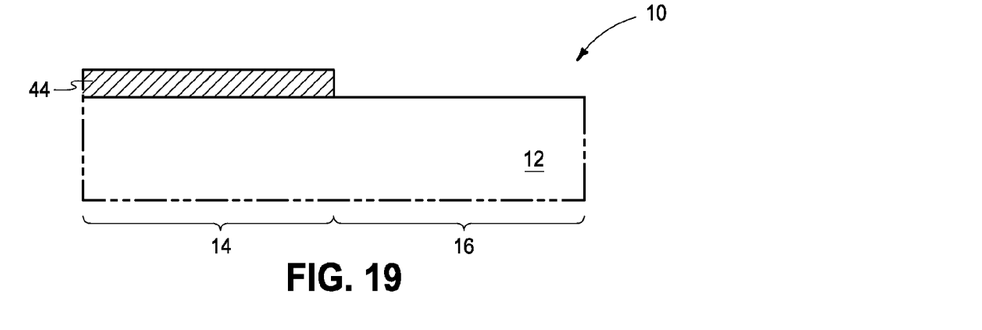

Another method for altering polynucleotide physisorption characteristics of region 14 relative to region 16 is described with reference to FIGS. 19-21. Referring to FIG. 19, a conductive material 44 is formed and patterned across the semiconductor substrate 12. Material 44 may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). The material 44 may be patterned with any suitable processing, including, for example, utilization of a patterned mask (not shown) and suitable etching; and/or direct deposition of material 44 into the desired pattern. The material 44 may be patterned in any suitable configuration, including, for example, wiring, a memory cell array, etc.

Figure 20:
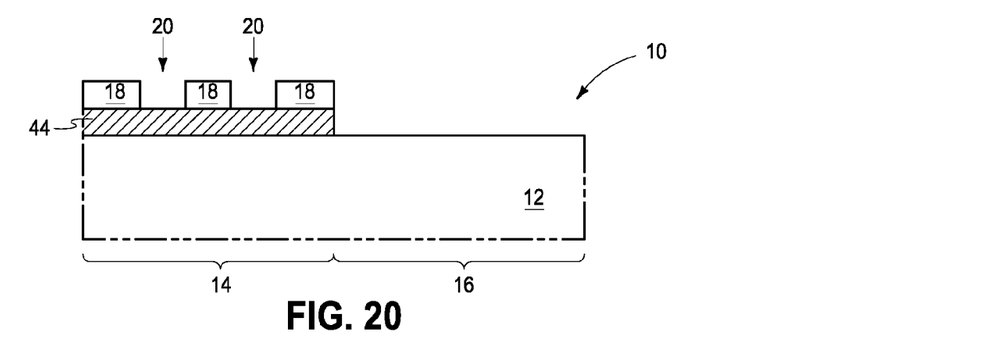
Figure 21:
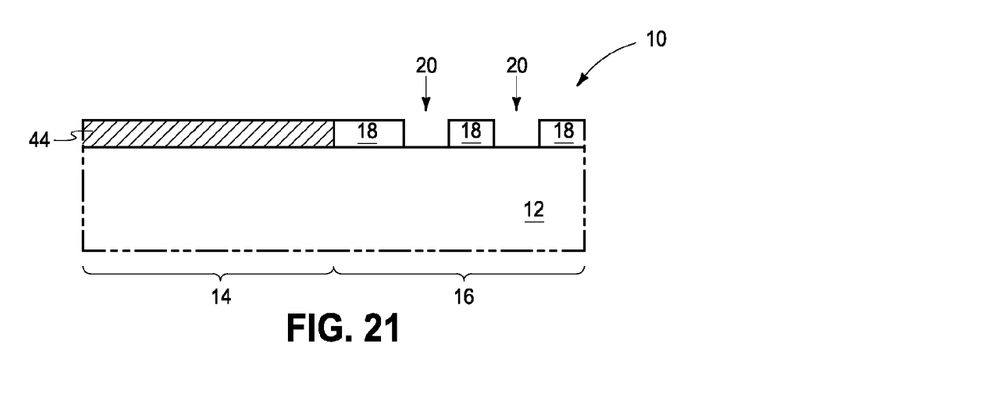

Referring to FIGS. 20 and 21, the construction of FIG. 19 is illustrated after it has been exposed to polynucleotide which selectively adheres to region 14 relative to region 16 (FIG. 20), or to region 16 relative to region 14 (FIG. 21). In the shown embodiments, the polynucleotide self-assembles to form a pattern with openings 20 extending therethrough, analogous to the pattern described above with reference to FIG. 2. In subsequent processing, a pattern from the polynucleotide may be transferred into or through materials underlying the polynucleotide analogous to the processing described above with reference to FIGS. 4 and 7, and/or the pattern from the polynucleotide may be utilized for patterning a dopant implant in processing analogous to that described above with reference to FIGS. 5 and 8. For instance, in processing subsequent to that of FIG. 20, the pattern from the mask of polynucleotide 18 may be transferred into or through conductive material 44 to fabricate such conductive material into one or more conductive components. Additionally, or alternatively, the polynucleotide 18 may be incorporated into an integrated assembly analogous to the assembly described above with reference to FIG. 9.

Although wiring 44 is shown formed over the surface of substrate 12, in other embodiments the wiring may be in trenches that extend into substrate 12 (for instance, the wiring may be formed with damascene processing) and/or the wiring may correspond to doped regions along the upper surface of substrate 12. In some embodiments in which the wiring corresponds to doped regions, processing analogous to that of FIGS. 20 and 21 may follow the processing stage of FIG. 11, FIG. 13 or FIG. 16.

In some embodiments, the processing of FIGS. 19-21 may utilize an alteration of the surface potential characteristics of region 14 relative to region 16, which in turn alters polynucleotide physisorption characteristics of region 14 relative to region 16. Specifically, electrical bias may be applied to the conductive material 44 to attract the polynucleotide and thereby enhance physisorption of the polynucleotide along the upper surface of the conductive material, or to repel the polynucleotide and thereby reduce physisorption of the polynucleotide along the upper surface of the conductive material. Electrical bias may be utilized similarly in embodiments of the types described above with reference to FIGS. 11, 13 and 16. Specifically, a doped region may be provided with sufficient dopant to become electrically conductive, and electrical bias may be provided to such electrically conductive region to either attract polynucleotide or repel polynucleotide. In some embodiments, electrical bias may be applied to both of regions 14 and 16 to alter surface potential of one of the regions relative to the other.

Figure 22:
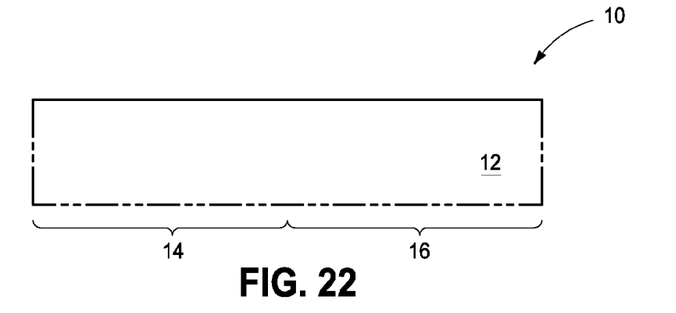
Figure 23:
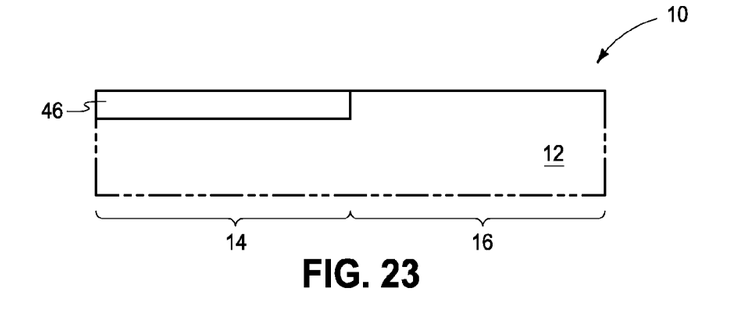

Another method for altering polynucleotide physisorption characteristics of region 14 relative to region 16 is described with reference to FIGS. 22 and 23. FIG. 22 shows construction 10 at a processing stage in which there is no difference between the upper surfaces of regions 14 and 16. FIG. 23 shows the construction after region 14 is exposed to a corona discharge which creates an altered upper portion 46 of region 14 and changes polynucleotide physisorption characteristics of region 14. Accordingly, the construction 10 at the processing stage of FIG. 23 has an altered first region 14 with different physisorption characteristics for polynucleotide relative to the second region 16. The altered first region may have enhanced affinity for polynucleotide relative to the second region in some embodiments, and in other embodiments may have reduced affinity for polynucleotide relative to the second region. Subsequent processing analogous to that described above with reference to FIGS. 1-9 may be conducted to form a polynucleotide mask across one of the regions 14 and 16 of FIG. 23, and to utilize such mask for fabrication of features associated with semiconductor substrate 12.

In some embodiments, the corona discharge may be considered an example of a method utilized to alter surface potential characteristics of the first region 14 relative to the second region 16.

Figure 24:
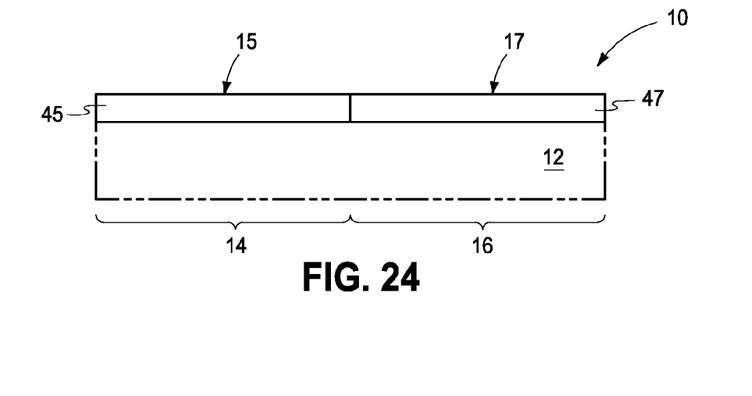

Another method for altering polynucleotide physisorption characteristics of region 14 relative to region 16 is described with reference to FIGS. 24 and 25. Referring to FIG. 24, regions 14 and 16 have upper surfaces 15 and 17 which differ relative to one another. The difference between upper surfaces 15 and 17 may be, for example, a difference in physical characteristics, chemical characteristics, electrically characteristics, etc. In the shown embodiment, the upper surfaces 15 and 17 are along materials 45 and 47 which differ from one another. The construction of FIG. 24 is an example construction having upper surfaces of regions 14 and 16 differing relative to one another, and may be replaced with other suitable configurations in other embodiments. For instance, the construction of FIG. 24 may be replaced with any of the constructions of FIGS. 11, 13, 16, 18, 19 and 23 in other embodiments.

Figure 25:
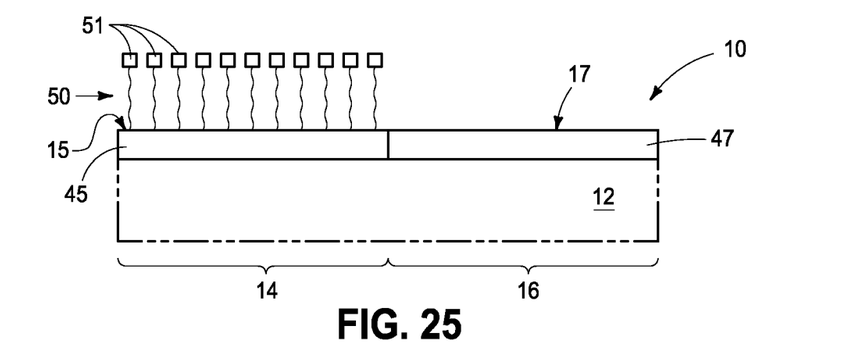

Referring to FIG. 25, construction 10 is exposed to material 50 which alters polynucleotide physisorption characteristics of the upper surface of region 14 relative to the upper surface of region 16. Material 50 has an oriented molecular arrangement relative to the upper surface of region 14, and does not adhere with the upper surface of region 16. The material 50 may comprise a brush layer, a self-assembling pattern (for instance, a self-assembling monolayer), etc. The individual molecules of material 50 may comprise head groups oriented toward the upper surface of region 14, and tail groups which extend outwardly from substrate 12. The tail groups may be considered to be terminal groups, and in the embodiment of FIG. 25 are indicated with boxes 51 (only some of which are labeled). Such terminal groups may be configured to either repel polynucleotide or attract polynucleotide. For instance, in some embodiments the terminal groups may be negatively charged, partially negatively charged, positively charged or partially positively charged. In some embodiments the terminal groups may comprise charged carboxylate groups or charged amino groups. In some embodiments, material 50 comprises poly(dimethylamino)ethyl methacrylate. In some embodiments, material 50 comprises one or more coordinated transition metals. In some embodiments, material 50 comprises a di-positive nickel macrocycle, such as, for example, dinickel (II) (2,2'-bis (1,3,5,8,12-pentaazacyclotetradec-3-yl)-diethyl disulfide) perchlorate.

The construction 10 at the processing stage of FIG. 25 has an altered first region 14 with different physisorption characteristics for polynucleotide relative to the second region 16. The altered first region may have enhanced affinity for polynucleotide relative to the second region in some embodiments, and in other embodiments may have reduced affinity for polynucleotide relative to the second region. Subsequent processing analogous to that described above with reference to FIGS. 1-9 may be conducted to form a polynucleotide mask across one of the regions 14 and 16 of FIG. 25, and to utilize such mask for fabrication of features associated with semiconductor substrate 12.

Figure 26:
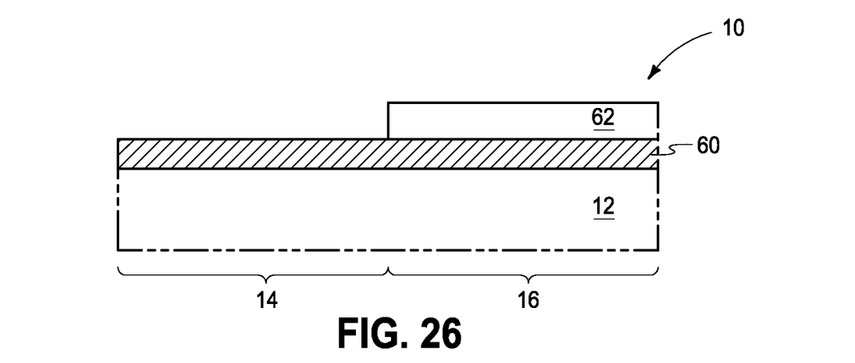

Another method for altering polynucleotide physisorption characteristics of region 14 relative to region 16 is described with reference to FIGS. 26 and 27. Referring to FIG. 26, a conductive material 60 extends across the regions 14 and 16 of semiconductor substrate 12. A masking material 62 covers the portion of conductive material 60 across region 16, while leaving the portion across region 14 exposed. In some embodiments, conductive material 60 may comprise wiring which extends across a memory array region and a peripheral region adjacent such memory array region. In such embodiments, the masking material 62 may protect the portion of the wiring across the peripheral region while leaving a remaining portion of the wiring exposed for further patterning, or vice versa.

Figure 27:
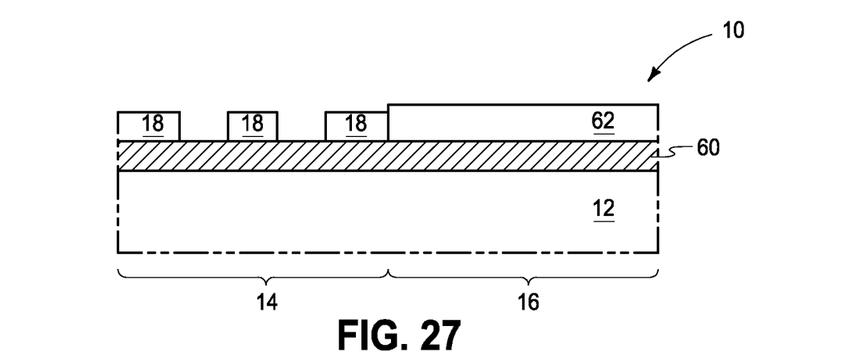

Referring to FIG. 27, construction 10 is illustrated after physisorption of polynucleotide 18 onto the exposed portion of conductive material 60, and after self-assembly of the polynucleotide to form a pattern.

The physisorption of polynucleotide 18 onto conductive material 60 may comprise application of an electrical bias to the conductive material to attract the polynucleotide onto an upper surface of the conductive material. Although the illustrated conductive material is wiring provided over semiconductor substrate 12, in other embodiments other conductive configurations may be utilized. For instance, the conductive material may correspond to dopant provided within substrate 12, to wiring provided within trenches in the substrate through damascene processing, etc. In some applications, wiring 60 may be replaced with a molecular arrangement 50 of the type shown in FIG. 25, and mask 62 may be utilized to cover part of the molecular arrangement while leaving the remainder of the molecular arrangement exposed for physisorption of polynucleotide.

The polynucleotide 18 of FIG. 27 may be considered to form a patterned mask over region 14. In subsequent processing, such patterned mask may be utilized in processing analogous to that described above with reference to FIGS. 3-8 for fabricating features associated with substrate 12.

The physisorption of the embodiments of FIGS. 1-27 may be utilized in combination with other processes. For instance, in some embodiments physisorption may be combined with chemical bonding (i.e., chemisorption) to lock a polynucleotide into a desired configuration. Example chemisorption may comprise chemical bonding of polynucleotide to a substrate (for instance, thermal or ultraviolet assisted cross-linking of the polynucleotide to the substrate). In some embodiments, physisorption may be used to loosely orient polynucleotide to a surface, and then chemisorption may be used to lock the polynucleotide into a desired alignment.

The physisorption processes described herein may offer advantages relative to conventional methods. For instance, some conventional methods may not be suitable for semiconductor fabrication in that they may introduce undesired contaminants into a fabrication process. In contrast, methodology described herein may enable physisorption of polynucleotide to underlying materials through controlled ionic interactions (i.e., utilization of dopant, terminal groups of oriented molecules, electrostatic double layers in ionic solution, etc.), and/or through utilization of electrical bias. Accordingly, some embodiments provided herein advantageously enable polynucleotide physisorption onto semiconductor substrates while omitting problematic salts and other materials associated with conventional methods of polynucleotide physisorption.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "insulative" may be utilized to describe materials having insulative electrical properties. The terms are considered synonymous in this disclosure. The utilization of the term "dielectric" in some instances, and the term "insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of fabricating features associated with a semiconductor substrate. Surface potential characteristics of a first region of the semiconductor substrate are altered relative to a second region. The altered first region has different physisorption characteristics for polynucleotide relative to the second region. The altered first region and the second region are exposed to polynucleotide. The polynucleotide selectively adheres to either the altered first region or the second region to form a polynucleotide mask. The polynucleotide mask is used during fabrication of features associated with the semiconductor substrate.

Some embodiments include a method of fabricating features associated with a semiconductor substrate. Dopant is provided into a first region of the semiconductor substrate to alter the first region relative to a second region. The altered first region has different physisorption characteristics for polynucleotide relative to the second region. The altered first region and the second region are exposed to polynucleotide. The polynucleotide selectively adheres to either the altered first region or the second region to form a polynucleotide mask. The polynucleotide mask is used during fabrication of features associated with the semiconductor substrate.

Some embodiments include a method of fabricating features associated with a semiconductor substrate. A material is deposited across a first region of the semiconductor substrate to alter the first region relative to a second region. The altered first region has different physisorption characteristics for polynucleotide relative to the second region. The deposition incorporates components within the material that alter the physisorption characteristics of the material for the polynucleotide. The altered first region and the second region are exposed to polynucleotide. The polynucleotide selectively adheres to either the altered first region or the second region to form a polynucleotide mask. The polynucleotide mask is used during fabrication of features associated with the semiconductor substrate.

Some embodiments include a method of fabricating features associated with a semiconductor substrate. A material is formed across a first region of the semiconductor substrate to alter the first region relative to a second region. The altered first region has different physisorption characteristics for polynucleotide relative to the second region. The forming of the material comprises orienting a molecular arrangement relative to a surface of the semiconductor substrate. The altered first region and the second region are exposed to polynucleotide. The polynucleotide selectively adheres to either the altered first region or the second region to form a polynucleotide mask. The polynucleotide mask is used during fabrication of features associated with the semiconductor substrate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of fabricating features associated with a semiconductor substrate, comprising:
    altering surface potential characteristics of a first region of the semiconductor substrate relative to a second region; the altered first region having different physisorption characteristics for polynucleotide relative to the second region;
    exposing the altered first region and the second region to polynucleotide; the polynucleotide selectively adhering to either the altered first region or the second region to form a polynucleotide mask;
    using the polynucleotide mask during fabrication of features associated with the semiconductor substrate; and
    wherein the using of the polynucleotide mask during fabrication of the features includes, etching into the semiconductor substrate while using the polynucleotide mask to define a pattern for the etch.

2. A method of fabricating features associated with a semiconductor substrate, comprising:
    altering surface potential characteristics of a first region of the semiconductor substrate relative to a second region; the altered first region having different physisorption characteristics for polynucleotide relative to the second region;
    exposing the altered first region and the second region to polynucleotide; the polynucleotide selectively adhering to either the altered first region or the second region to form a polynucleotide mask;
    using the polynucleotide mask during fabrication of features associated with the semiconductor substrate;
    wherein the surface potential characteristics are altered by providing an electrical bias to at least one of the first and second regions; and
    wherein wiring is provided along the first region, and wherein the electrical bias is provided along the wiring to selectively adhere the polynucleotide to the wiring relative to the second region of the substrate or to selectively repel polynucleotide from the wiring relative to the second region of the substrate.

3. The method of claim 2 wherein the wiring comprises one or more materials formed over the substrate.

4. The method of claim 2 wherein the wiring comprises dopant implanted into the substrate.

5. A method of fabricating features associated with a semiconductor substrate, comprising:
   altering surface potential characteristics of a first region of the semiconductor substrate relative to a second region; the altered first region having different physisorption characteristics for polynucleotide relative to the second region;
   exposing the altered first region and the second region to polynucleotide; the polynucleotide selectively adhering to either the altered first region or the second region to form a polynucleotide mask;
   using the polynucleotide mask during fabrication of features associated with the semiconductor substrate; and
   wherein the surface potential characteristics are altered utilizing a corona discharge to selectively alter surface potential characteristic of the first region relative to the second region.

6. A method of fabricating features associated with a semiconductor substrate, comprising:
   altering surface potential characteristics of a first region of the semiconductor substrate relative to a second region; the altered first region having different physisorption characteristics for polynucleotide relative to the second region;
   exposing the altered first region and the second region to polynucleotide; the polynucleotide selectively adhering to either the altered first region or the second region to form a polynucleotide mask;
   using the polynucleotide mask during fabrication of features associated with the semiconductor substrate;
   wherein the surface potential characteristics are altered by providing an electrical bias to at least one of the first and second regions; and
   wherein insulative material extends across the first and second regions; and
   wherein the surface potential characteristics of the first region are altered by providing conductive material across the first region and subsequently applying the electrical bias to the conductive material.

7. The method of claim 6 wherein the conductive material includes an oriented molecular arrangement.

8. The method of claim 6 wherein the conductive material includes conductively-doped semiconductor material.

9. A method of fabricating features associated with a semiconductor substrate, comprising:
   providing dopant into a first region of the semiconductor substrate to alter the first region relative to a second region; the altered first region having different physisorption characteristics for polynucleotide relative to the second region;
   exposing the altered first region and the second region to polynucleotide; the polynucleotide selectively adhering to either the altered first region or the second region to form a polynucleotide mask; and
   using the polynucleotide mask during fabrication of features associated with the semiconductor substrate.

10. The method of claim 9 wherein the using of the polynucleotide mask during fabrication of the features includes one or more of incorporating at least some of the polynucleotide mask into an integrated assembly, etching into the semiconductor substrate while using the polynucleotide mask to define a pattern for the etch, and adhering one or more materials to the polynucleotide mask to pattern said one or more materials.

11. The method of claim 9 wherein said providing of the dopant comprises implanting the dopant into the first region.

12. The method of claim 9 wherein said providing of the dopant comprises implanting the dopant into the first region utilizing shallow ion implantation and/or plasma doping (PLAD).

13. The method of claim 9 wherein the first and second regions comprise semiconductor material of the semiconductor substrate.

14. The method of claim 9 wherein the first and second regions comprise a second material formed over semiconductor material of the semiconductor substrate.

15. The method of claim 14 wherein the second material is insulative.

16. The method of claim 14 wherein the second material is conductive.

17. The method of claim 9 wherein the dopant is initially within a layer formed across the first region, and is provided into the first region by transferring the dopant from the layer into the first region.

18. A method of fabricating features associated with a semiconductor substrate, comprising:
   depositing a material across a first region of the semiconductor substrate to alter the first region relative to a second region; the altered first region having different physisorption characteristics for polynucleotide relative to the second region; the depositing incorporating components within the material that alter the physisorption characteristics of the material for the polynucleotide;
   exposing the altered first region and the second region to polynucleotide; the polynucleotide selectively adhering to either the altered first region or the second region to form a polynucleotide mask; and
   using the polynucleotide mask during fabrication of features associated with the semiconductor substrate.

19. The method of claim 18 wherein the using of the polynucleotide mask during fabrication of the features includes one or more of incorporating at least some of the polynucleotide mask into an integrated assembly, etching into the semiconductor substrate while using the polynucleotide mask to define a pattern for the etch, and adhering one or more materials to the polynucleotide mask to pattern said one or more materials.

20. The method of claim 18 wherein the depositing comprises one or both of atomic layer deposition or chemical vapor deposition.

21. The method of claim 18 wherein the material is insulative.

22. The method of claim 18 wherein the material is conductive.

23. The method of claim 18 wherein the components include one or more of organometallics, hydrogen, and organo-alkaline earth compounds.

24. The method of claim 18 wherein the components include one or both of calcium and magnesium.

25. The method of claim 18 wherein the components include trapped charges.

26. A method of fabricating features associated with a semiconductor substrate, comprising:
   forming a material across a first region of the semiconductor substrate to alter the first region relative to a second region; the altered first region having different physisorption characteristics for polynucleotide relative to the second region; the forming of the material comprising orienting a molecular arrangement relative to a surface of the semiconductor substrate; the molecular arrangement comprising a brush layer formed along a surface of the first region, or a self-assembling pattern formed along the surface of the first region;

exposing the altered first region and the second region to polynucleotide; the polynucleotide selectively adhering to either the altered first region or the second region to form a polynucleotide mask; and using the polynucleotide mask during fabrication of features associated with the semiconductor substrate.

27. The method of claim 26 wherein the using of the polynucleotide mask during fabrication of the features includes one or more of incorporating at least some of the polynucleotide mask into an integrated assembly, etching into the semiconductor substrate while using the polynucleotide mask to define a pattern for the etch, and adhering one or more materials to the polynucleotide mask to pattern said one or more materials.

28. The method of claim 26 wherein the molecular arrangement comprises the brush layer.

29. The method of claim 26 wherein the molecular arrangement comprises the self-assembling pattern.

30. The method of claim 26 wherein the molecular arrangement comprises negatively-charged terminal groups to repel the polynucleotide.

31. The method of claim 26 wherein the molecular arrangement comprises positively-charged terminal groups to attract the polynucleotide.

32. The method of claim 26 wherein the molecular arrangement comprises poly(dimethylamino)ethyl methacrylate.

33. The method of claim 26 wherein the molecular arrangement comprises a coordinated transition metal.

* * * * *